US009847559B2

(12) United States Patent
Niwa (10) Patent No.: US 9,847,559 B2
(45) Date of Patent: Dec. 19, 2017

(54) CHARGING AND DISCHARGING INSPECTION DEVICE AND CHARGING AND DISCHARGING INSPECTION METHOD FOR THIN SECONDARY BATTERY

(71) Applicant: NISSAN MOTOR CO., LTD., Yokohama-shi, Kanagawa (JP)

(72) Inventor: Yoshikazu Niwa, Hadano (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 196 days.

(21) Appl. No.: 14/888,136

(22) PCT Filed: Mar. 14, 2014

(86) PCT No.: PCT/JP2014/056925
§ 371 (c)(1),
(2) Date: Oct. 30, 2015

(87) PCT Pub. No.: WO2014/178236
PCT Pub. Date: Nov. 6, 2014

(65) Prior Publication Data
US 2016/0079635 A1      Mar. 17, 2016

(30) Foreign Application Priority Data

May 1, 2013    (JP) ................................ 2013-096145

(51) Int. Cl.
*H01M 10/42*      (2006.01)
*H01M 10/0585*    (2010.01)
(Continued)

(52) U.S. Cl.
CPC ...... *H01M 10/4285* (2013.01); *G01R 1/0416* (2013.01); *G01R 1/06711* (2013.01);
(Continued)

(58) Field of Classification Search
CPC ............. H01M 10/4285; G01R 1/0416; G01R 1/06711; G01R 1/06722; G01R 1/06738
(Continued)

(56) References Cited

U.S. PATENT DOCUMENTS 8,889,278 B2    11/2014  Lee et al.
9,136,567 B2 *  9/2015   Nishihara ........... H01M 10/482
(Continued)

FOREIGN PATENT DOCUMENTS

EP      2398089 A2    12/2011
JP    2002134176 A     5/2002
(Continued)

*Primary Examiner* — M'Baye Diao
(74) *Attorney, Agent, or Firm* — Young Basile Hanlon & MacFarlane, P.C.

(57) ABSTRACT

A plurality of batteries is stacked, together with spacers, in a compressed state. Charging and discharging units are arranged facing lead terminals protruding from the batteries and are independently operable for the respective batteries. The charging and discharging units each independently include substantially V-like shaped power-side and measurement-side contact elements elastically supported by compression coil springs and having floating freedom. When the batteries are moved all together toward the charging and discharging units, front end surfaces of the lead terminals are pressed against and electrically connected to flat surfaces of the power-side and measurement-side contact elements. By this, it is possible to smoothly perform charging and discharging inspection on the batteries even when the lead terminals protruding from the battery package are subjected in advance to surface treatment.

8 Claims, 8 Drawing Sheets

(51) Int. Cl.
   *H01M 2/20*    (2006.01)
   *H01M 2/30*    (2006.01)
   *H01M 10/0525* (2010.01)
   *H01M 10/44*   (2006.01)
   *H01M 10/48*   (2006.01)
   *G01R 1/04*    (2006.01)
   *G01R 1/067*   (2006.01)
   *G01R 31/36*   (2006.01)
   *H01M 2/10*    (2006.01)

(52) U.S. Cl.
   CPC ..... *G01R 1/06722* (2013.01); *G01R 1/06738* (2013.01); *G01R 31/3627* (2013.01); *G01R 31/3641* (2013.01); *H01M 2/1061* (2013.01); *H01M 2/204* (2013.01); *H01M 2/30* (2013.01); *H01M 10/0525* (2013.01); *H01M 10/0585* (2013.01); *H01M 10/441* (2013.01); *H01M 10/48* (2013.01); *H01M 10/482* (2013.01)

(58) Field of Classification Search
   USPC .......................................................... 324/426
   See application file for complete search history.

(56) References Cited

U.S. PATENT DOCUMENTS

| | | |
|---|---|---|
| 2011/0223453 A1 | 9/2011 | Lee et al. |
| 2011/0309837 A1 | 12/2011 | Nishihara et al. |
| 2016/0097501 A1* | 4/2016 | Yoshitani ................ H02J 7/025 |
| | | 362/183 |
| 2016/0126541 A1* | 5/2016 | Goto .................... H01M 4/0445 |
| | | 429/231.8 |
| 2016/0218327 A1* | 7/2016 | Takahashi ........... H01M 2/0275 |

FOREIGN PATENT DOCUMENTS

| | | |
|---|---|---|
| JP | 2004-319334 A | 11/2004 |
| JP | 2012-504845 A | 2/2012 |
| KR | 20120128403 A | 11/2012 |

\* cited by examiner

B-B CROSS SECTION

FIG. 7C

C-C CROSS SECTION

FIG. 8

1: LITHIUM ION SECONDARY BATTERY
2: LEAD TERMINAL
3: LEAD TERMINAL
13: MAGAZINE BASE PLATE
22: CHARGING AND DISCHARGING UNIT
23: POWER-SIDE CONTACT ELEMENT (CONTACT PROBE)
24: MEASUREMENT-SIDE CONTACT ELEMENT (CONTACT PROBE)
35: FLAT SURFACE
e: FRONT END SURFACE OF LEAD TERMINAL

FIG. 9

CHARGING AND DISCHARGING INSPECTION DEVICE AND CHARGING AND DISCHARGING INSPECTION METHOD FOR THIN SECONDARY BATTERY

CROSS REFERENCE TO RELATED APPLICATION

The present application is based on Japanese Patent Application No. 2013-096145 filed on May 1, 2013, the entire content of which is herein incorporated by reference.

TECHNICAL FIELD

The present invention relates to a charging and discharging inspection device for a thin secondary battery as typified by a lithium ion secondary battery with a package of e.g. laminate film.

BACKGROUND

Japanese Laid-Open Patent No. 2004-319334 proposes a charging and discharging inspection system of the type for a thin secondary battery, which includes clips having respective pairs of clamp members to clamp positive and negative electrode terminal parts of the battery, energization and inspection contact elements attached to tip end portions of the clamp members for power energization and voltage measurement of the battery and rotation shafts disposed between middle portions of the respective pairs of the clamp members, such that the clamp members can be opened and closed about the rotation shafts to clamp the positive and negative electrode terminal parts between their tip end portions.

In the case of a laminate type lithium ion secondary battery, a battery element including positive and negative electrodes, electrolytic solution etc. is accommodated in a laminate film package with positive and negative electrode lead terminals protruding from the laminate film package. The laminate film package is properly sealed or closed by adhering thermally fusible resin films to the positive and negative electrode lead terminals, covering the battery element with two upper and lower laminate films of the laminate film package in such a manner as to sandwich the thermally fusible resin film adhering portions of the positive and negative electrode lead terminals between peripheral edge portions of the upper and lower laminate films, and then, thermally fusing peripheries of the upper and lower laminate films. The lead terminals are made of a metal material e.g. aluminum, copper etc. and are subjected in advance to surface treatment, thereby forming insulating films to not only impart insulating properties but also improve the interfacial adhesion of the thermally fusible resin films to the lead terminals. The laminate type lithium ion secondary battery of such structure is usable as, for example, a battery cell for a lithium ion battery pack in an electric vehicle.

When the above laminate type lithium ion secondary battery is applied to the charging and discharging inspection system of Japanese Laid-Open Patent No. 2004-319334, however, the insulating films on the lead terminals cause a large electrical resistance upon connection of the clips to the lead terminals so that the system cannot smoothly perform charging and discharging inspection on the battery.

More specifically, the system checks whether the contact elements of the clips are in adequately contact with the lead terminals of the respective electrodes and measures the voltage of the battery cell before shifting to a charging and discharging inspection mode. If the contact resistance becomes excessive under the influence of the insulating films on the lead terminals as mentioned above, the system cannot correctly measure the voltage of the battery cell and cannot shift to charging and discharging operation. The system of Japanese Laid-Open Patent No. 2004-319334 is thus not adaptable to the battery where the insulating films are formed on the lead terminals. There is still room for improvement in the charging and discharging inspection system.

SUMMARY

The present invention has been made in view of the foregoing circumstances. It is an object of the present invention to provide a charging and discharging inspection device and charging and discharging inspection method for a thin secondary battery of the type having a battery package and lead terminals protruding from the battery package, capable of smoothly performing charging and discharging inspection on the battery even when the lead terminals are subjected in advance to surface treatment.

According to one aspect of the present invention, there are provided a charging and discharging inspection device and charging and discharging inspection method for a thin secondary battery, using: a support member that supports the thin secondary battery; and contact probes arranged facing respective lead terminals of the thin secondary battery supported by the support member so as to come into contact with the respective lead terminals by approaching operation of the support member and the contact probes, wherein the contact probes have flat surfaces contactable with front end surfaces of the lead terminals in a protruding direction of the lead terminals such that the contact probes are electrically connected to the lead terminals by surface-to-surface contact between the flat surfaces of the contact probes and the front end surfaces of the lead terminals. It is herein assumed that base metal materials of the lead terminals are exposed at least at the front end surfaces of the lead terminals without being subjected to surface treatment.

In the present invention, the lead terminals protruding from the battery package are electrically connected to the contact probes by surface-to-surface contact between the front end surfaces of the lead terminals and the flat surfaces of the contact probes. It is therefore possible to, even when insulating films are formed in advance on the lead terminals by surface treatment, smoothly perform charging and discharging inspection on the battery without the influence of electrical resistance caused by the insulating films.

DETAILED DESCRIPTION OF THE EMBODIMENTS

Figure 1:
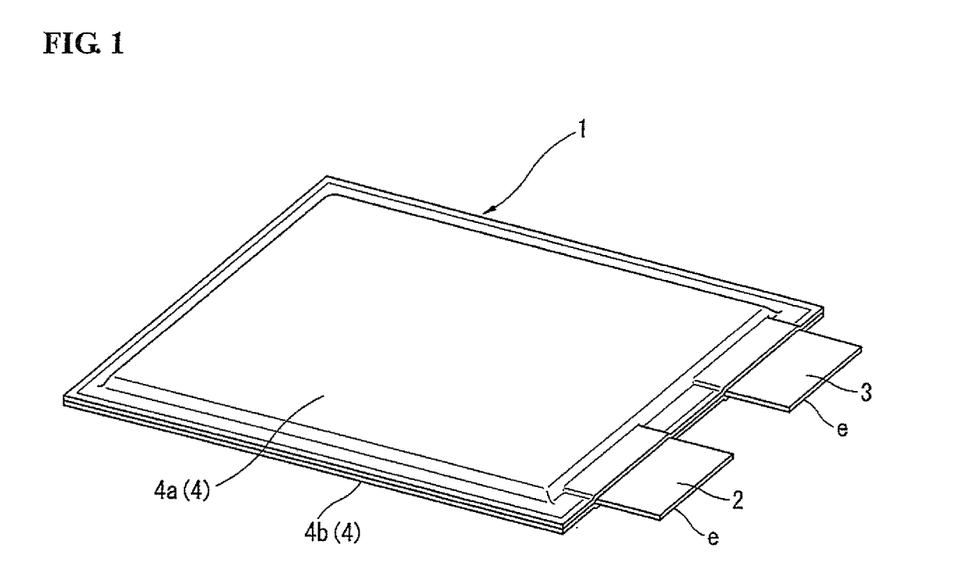
FIG. 1 is a perspective view a laminate type lithium ion secondary battery as an example of a thin secondary battery.
Figure 2:
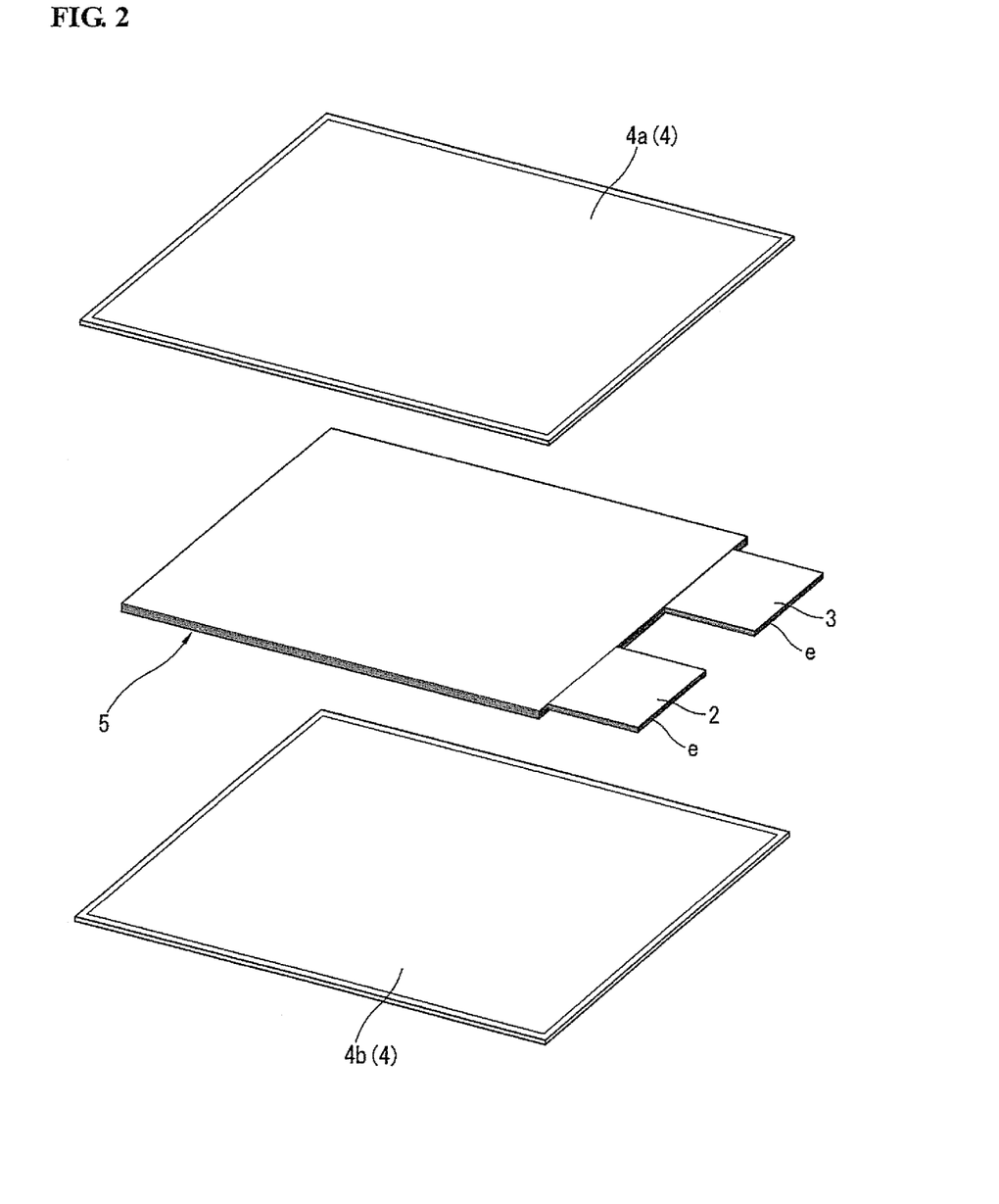
FIG. 2 is an exploded perspective view of the lithium ion secondary battery of FIG. 1.
Figure 5:
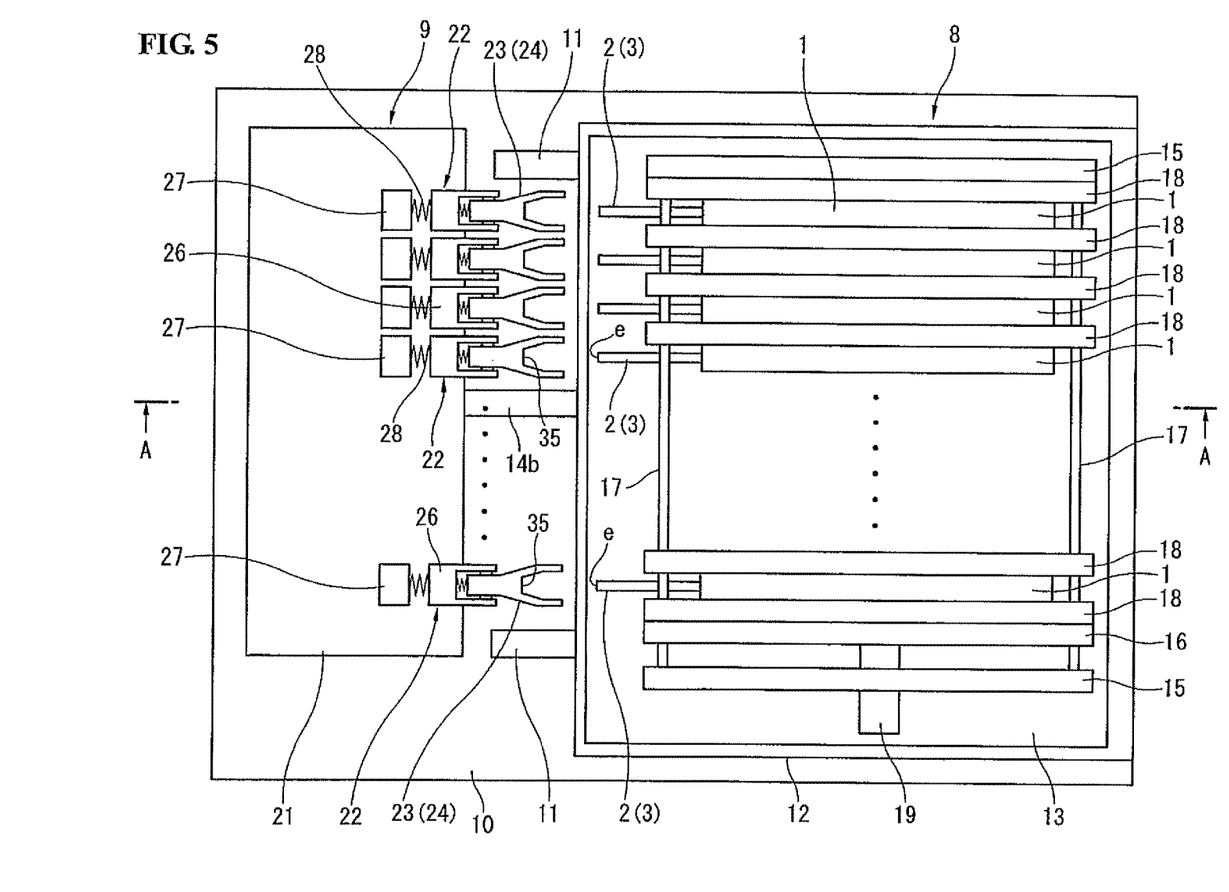
FIG. 5 is a plan view of a charging and discharging inspection device according to one embodiment of the present invention.
Figure 6:
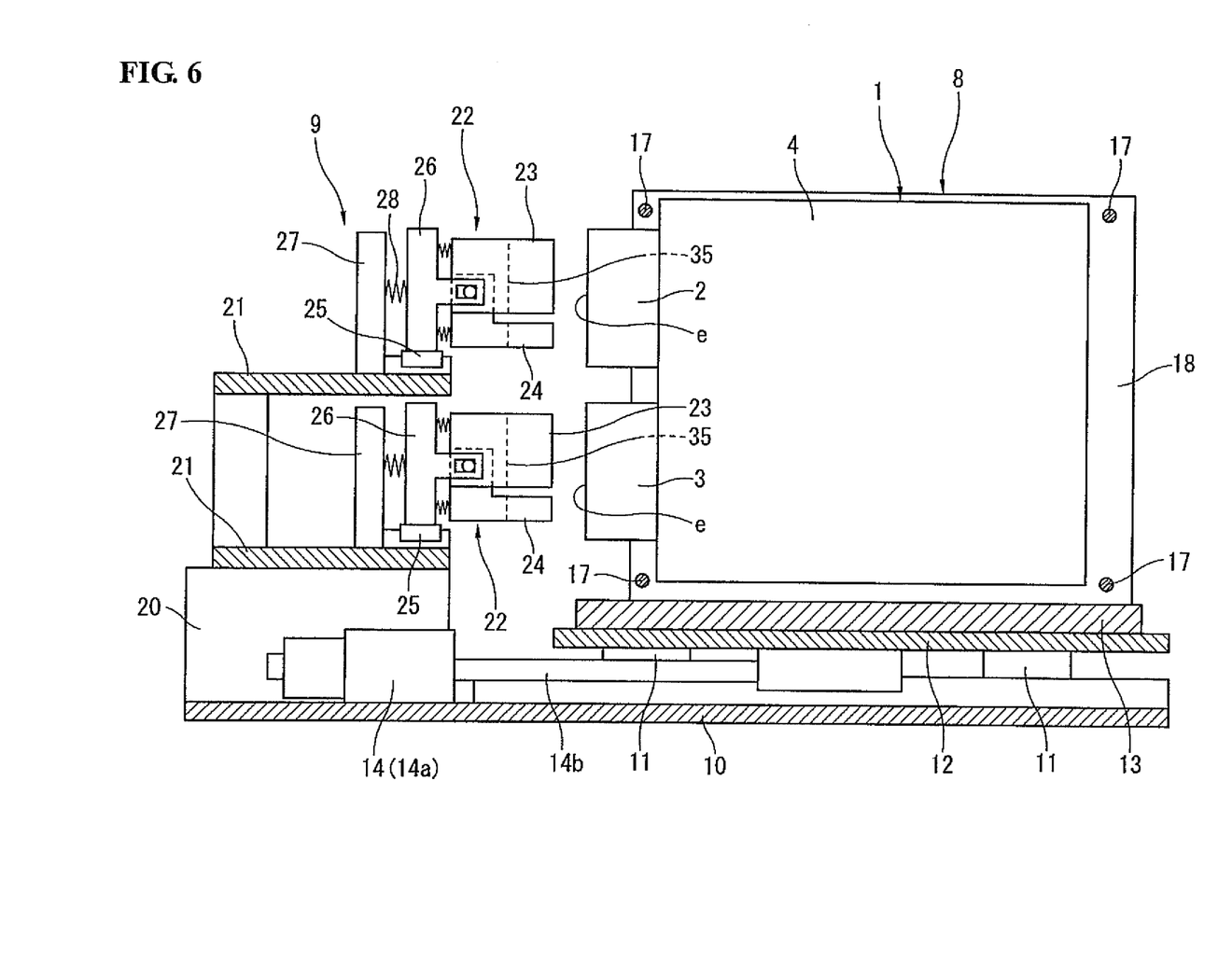
FIG. 6 is a section view of the charging and discharging inspection device taken along line A-A of FIG. 5.

A charging and discharging inspection device according to one embodiment of the present invention will be described below with reference to FIGS. 1 to 9. FIG. 1 is a perspective view of a laminate type lithium ion secondary battery 1 (hereinafter simply referred to as "battery") as an example of a thin secondary terminal to be tested by charging and discharging inspection. FIG. 2 is an exploded view of the battery 1 shown in FIG. 1. FIG. 5 is a plan view of the entire charging and discharging inspection device according to one embodiment of the present invention. FIG. 6 is a section view of the charging and discharging inspection device taken along line A-A of FIG. 5.

As shown in FIGS. 1 and 2, the battery 1 has a lead terminal (positive electrode terminal part) 2 as electrode terminals of positive electrodes, a lead terminal (negative electrode terminal part) 3 as electrode terminals of negative electrodes and a rectangular laminate film package 4 formed of two upper and lower laminate films 4a and 4b. The lead terminals 2 and 3 are arranged outward from the laminate film package 4. The laminate film package 4 accommodate therein, as a battery element (power generating element), a stacked body 5 in which the positive and negative electrodes are stacked in pairs via separators together with an electrolytic solution. Four peripheral sides of the laminate film package 4 are hermetically sealed or closed by thermal fusion.

In other words, the battery 1 secures its airtightness by surrounding the battery element such as positive and negative electrodes, separators and electrolytic solution with the laminate film package 4 with the lead terminals 2 and 3 of thin plate shape being electrically connected to respective collectors of the positive and negative electrodes protruding outward from the laminate film package 4, and then, thermally fusing and sealing or closing the peripheries of the laminate film package 4 into e.g. a rectangular bag shape. As the two upper and lower laminate films 4a and 4b of the laminate film package 4, there can be used those of composite structure in which e.g. an aluminum foil sheet is covered with a thermally fusible resin film.

Both of the positive and negative electrode lead terminals 2 and 3 protrude outward from one common side of the rectangular laminate film package 4. These lead terminals 2 and 3 may also be referred to as electrode tabs. The positive electrode lead terminal 2 can be made of e.g. aluminum, whereas the negative electrode lead terminal 3 can be made of e.g. aluminum or copper.

Figure 3:
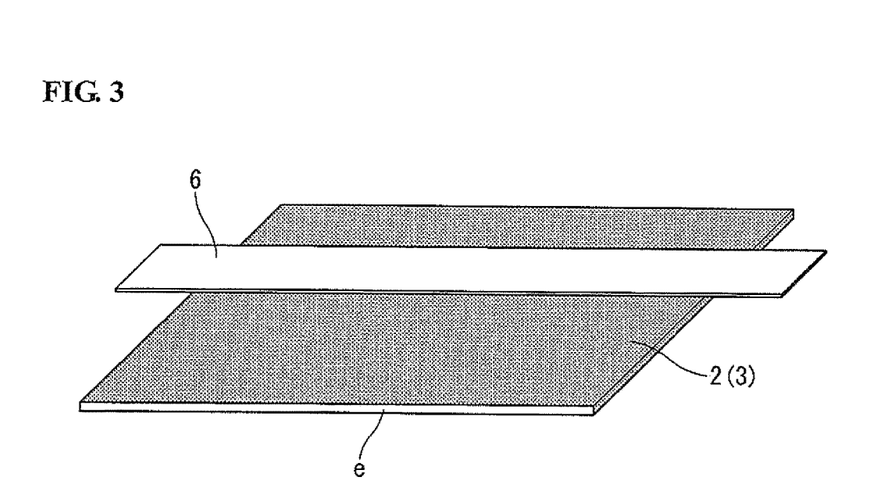
FIG. 3 is a schematic view of a lead terminal for use in the lithium ion secondary battery of FIGS. 1 and 2.

After the lead terminals 2 and 3 are subjected to predetermined surface treatment, thermally fusible resin films are adhered to portion of the lead terminals 2 and 3 to which the laminate films 4a and 4b are bonded by thermal fusion. FIG. 3 is a schematic view showing the detailed configuration of the lead terminal 2, 3 alone. In the case where that the lead terminal 2, 3 is made of aluminum alloy, the thermally fusible resin film 6 is adhered in advance to the portion of the lead terminal 2, 3 to which the laminate film 4a, 4b of the laminate film package 4 is bonded by thermal fusion. In order to ensure the adhesion of the thermally fusible resin film 6 to the lead terminal 2, 3, oxide coating treatment such as boehmite treatment is conducted as the surface treatment.

Figure 4:
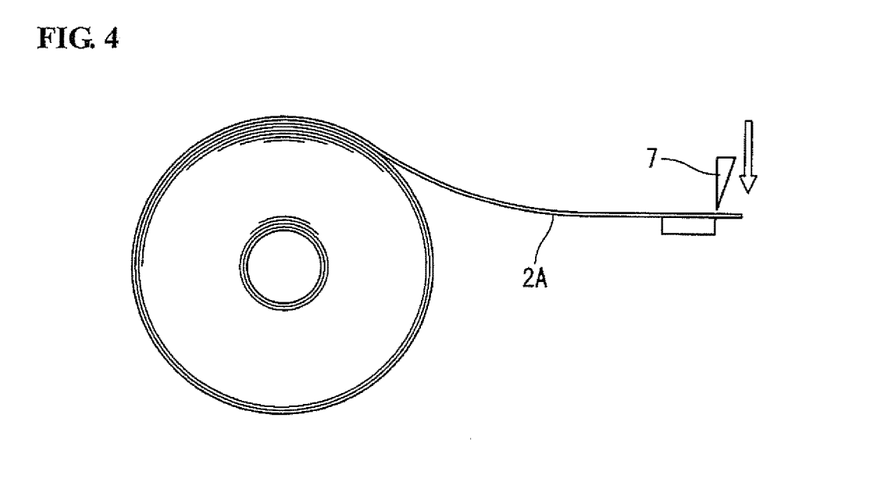
FIG. 4 is a schematic view showing a production process of the lead terminal of FIG. 3.

Increase in cost is inevitable when the lead terminal 2, 3 is cut into a given size and then individually subjected to oxide coating treatment such as boehmite treatment. For this reason, it is often the case to produce the lead terminal 2, 3 of FIG. 3 by preparing a base metal material 2A in an elongated strip shape with a predetermined width dimension, subjecting the base metal material 2A to oxide coating treatment, winding the base metal material 2A into a roll, and then, cutting the base metal material 2A into a given size with the use of a cutter 7 while drawing the base metal material from the roll as shown in FIG. 4. The base metal material is accordingly exposed at a straight front end surface e of the lead terminal 2, 3 in the direction in which the lead terminal 2, 3 protrudes from the laminate film package 4, without having been subjected to oxide coating treatment, in an assembled state of the battery 1 as shown in FIGS. 1 and 2. Other surfaces of the lead terminal 2, 3 are covered with oxide coatings.

It is herein noted that: the plurality of the positive electrodes, which constitute a part of the stacked body 5 as shown in FIG. 2, have extension portions stacked together and joined by welding to the positive electrode lead terminal 2; and the plurality of the negative electrodes similarly have extension portions stacked together and joined by welding to the negative electrode lead terminal 3. These configurations are however omitted from FIG. 2 for purposes of illustration.

FIG. 5 is a plan view of the charging and discharging inspection device. FIG. 6 is a section view of the charging and discharging inspection device take along line A-A of FIG. 5. As shown in these figures, the charging and discharging inspection device mainly includes a magazine mechanism 8 on the right side and an inspection mechanism 9 on the left side. The magazine mechanism 8 and the inspection mechanism 9 are located on a common bottom plate 10.

In the magazine mechanism 8, a large rectangular table 12 is placed on the common bottom plate 10 through a pair of linear guides 11. A magazine base plate 13 is placed as a smaller-size support member on the table 12. A linear actuator 14 (hereinafter simply referred to as "actuator") such as double rod cylinder is mounted on the bottom plate 10 with a cylinder tube 14a of the actuator 14 fixed to the bottom plate 10 and a piston rod 14b of the actuator 14 arranged astride the magazine mechanism 8 and the inspection mechanism 9 and coupled to a lower side of the table 12. Thus, the table 12 is allowed to approach or separate from the inspection mechanism 9 by expansion or contraction movement of the actuator 14.

As shown in FIG. 5, two fixed plates 15 stand facing each other on the magazine base plate 13; and one movable plate 16 stands between the two fixed plates 15 on the magazine base plate 13. The two fixed plates 15 are fixed to the magazine base plate 13 as well as linked to each other by four tie rods 17 such that the one movable plate 16 is slidable and movable as guided by the tie rods 17. A plurality of spacers 18 are disposed between one of the fixed plates 15 and the movable plate 16 in the same support configuration as the movable plate 16. A driving unit 19 is mounted to the other of the fixed plates 16 with a movable part of the drive unit 19 coupled to the movable plate 16. As the driving unit, there can be used e.g. a combination unit of an electric motor and a ball screw. The movable plate 16 is thus slidable along the four tie rods 17 by operation of the driving unit 19.

By inserting a plurality of the batteries 1 between respective adjacent two of the spaces 18 in such a manner that the lead terminals 2 and 3 of the batteries 1 face the inspection mechanism 9, and then, moving the movable plate 16 to the upper side of FIG. 5 by operation of the driving unit 19, the batteries 1 are pressurized or compressed under a predetermined pressure and thereby flattened as shown in FIG. 5. In this way, the plurality of the batteries 1 are arranged, together with the spacers 18, in a stacked state at given pitches on the magazine base plate 13 while the lead terminals 2 and 3 of each of the batteries 1 are vertically aligned and set to inspection positions with respect to the inspection mechanism 9.

In the inspection mechanism 9, a base seat 20 is placed on the common bottom plate 10. Upper and lower horizontal mounting stages 21 are disposed on the base seat 20. A plurality of charging and discharging units 22 are mounted on the respective mounting stages 21 along the direction of stacking of the batteries 1 on the magazine mechanism 8. These charging and discharging units 22 are independently operable for the respective batteries 1 on the magazine mechanism 8 and each has a pair of power-side and measurement-side contact elements 23 and 24 supported as contact probes as will be explained below.

Figure 7A:
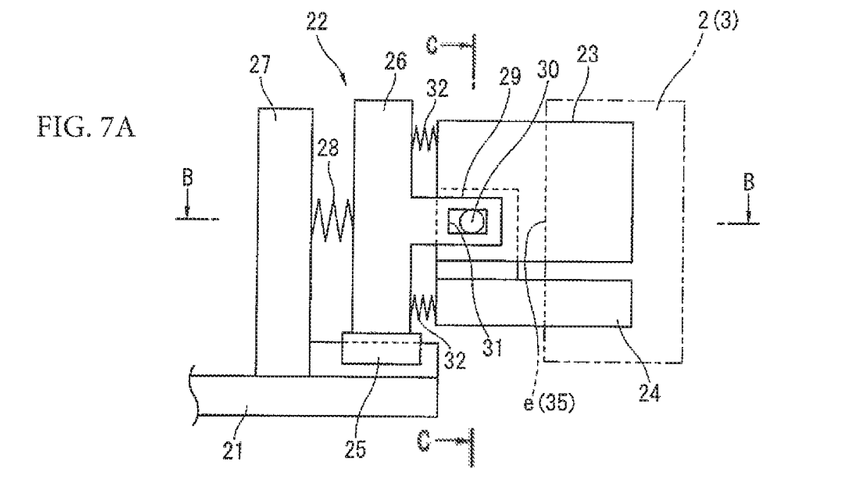
FIG. 7 is a schematic view of a substantive part of the charging and discharging inspection device shown in FIG. 6, where (A) is an enlarged view of a charging and discharging unit of the charging and discharging inspection device; (B) is a section view of the charging and discharging unit taken along line B-B of (A); and (C) is a section view of the charging and discharging unit taken along line C-C of (A).

FIG. 7 is a schematic view showing the detailed configuration of the charging and discharging unit 22. In each charging and discharging unit, a slider 26 is disposed on the mounting stage 21 through a linear guide 25 so as to be movable back and forth relative to the battery 1 on the magazine mechanism 8. A support block 27 is placed on a back side of the slider 26. A compression coil spring 28 is disposed as an elastic member between the slider 26 and the support block 27 so that the slider 26 is biased toward the battery 8 on the magazine mechanism 1 all the time by the compression coil spring 28.

The slider 26 has an arm portion 29 at a middle part in a height direction thereof. The arm portion 29 is substantially bifurcated in shape when viewed in plan. A power-side contact element 23 and a measurement-side contact element 24 are supported as a pair of contact probes on the arm portion 29 through a shaft member 30 and an elongated hole 31 of the arm portion 29. Compression coil springs 32 are disposed as elastic members between the slider 26 and the power-side and measurement-side contact elements 23 and 24 so that the power-side and measurement-side contact elements 23 and 24 are not only supported on the arm portion 29 through the shaft member 30 and the elongated hole 31 but also biased toward the battery 8 on the magazine mechanism 1 all the time by the compression coil springs 32. Thus, the power-side and measurement-side contact elements 23 and 24 are pivotable and rotatable about the shaft member 30. The shaft member 30 herein serves as a pivot axis perpendicular (orthogonal) to a plane direction of the lead terminal 2, 3.

The power-side and measurement-side contact elements 23 and 24 are also movable back and forth within the range of the elongated hole 31. As mentioned above, the power-side and measurement-side contact elements 23 and 24 are biased toward the battery 1 on the magazine mechanism 8 all the time by the compression coil springs 32. As the power-side and measurement-side contact elements 23 and 24 are biased toward the battery 1 on the magazine mechanism 8 all the time by the compression coil springs 32 while being rendered pivotable and rotatable about the shaft member 30 and movable back and forth within the range of the elongated hole 31, the power-side and measurement-side contact elements 23 and 24 can be self-maintained as shown in FIG. 7 in a free state.

Figures 7B, 7C:
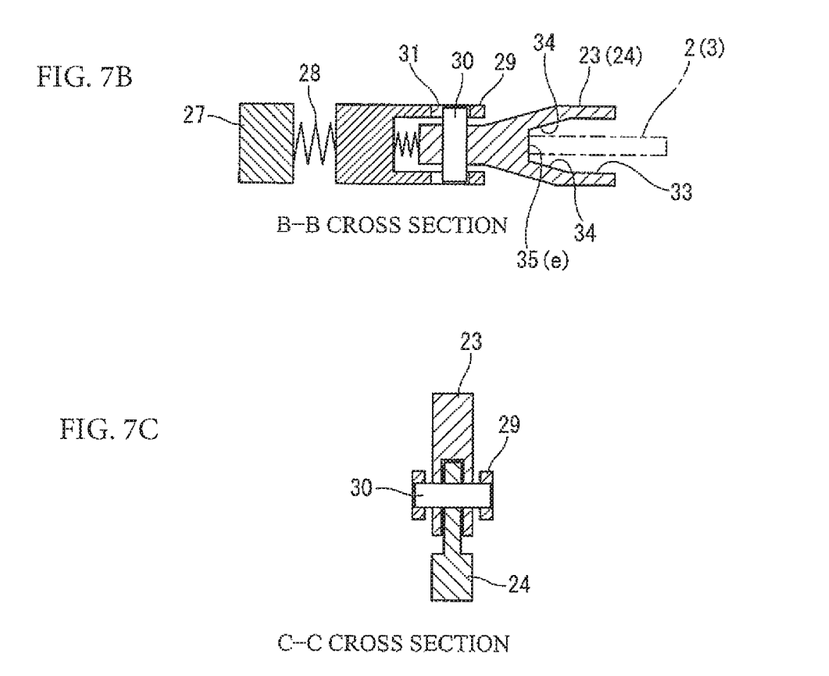

The power-side and measurement-side contact elements 23 and 24 are made of e.g. brass as the contact probes. As shown in FIG. 7(B), front end portions of the power-side and measurement-side contact elements 23 and 24 are substantially V-like shaped when viewed in plan. Each of the power-side and measurement-side contact elements 23 and 24 have a V-like shaped receiving groove 33 defined by opposing tapered surfaces 34 so as to increase in width toward the battery 1 on the magazine mechanism 8, whereby there is a flat surface 35 formed with a predetermined width dimension between deepest or innermost parts of the opposing tapered surfaces 34 in the receiving groove 33. The width dimension of the flat surface 35 is set sufficiently larger than that of the lead terminal 2, 3.

Although not specifically shown in FIG. 7, the power-side and measurement-side contact elements 23 and 24 are kept insulated by electrical insulation treatment so as to function as independent electrical contact elements in each of the charging and discharging units 22. Similarly, the power-side and measurement-side contact elements 23 and 24 are kept insulated from the slider 26 by electrical insulation treatment. Further, the power-side and measurement-side contact elements 23 and 24 are connected to a power supply device (charging device) and a measurement device such as voltmeter, respectively, for their respective functions although not shown in the drawing.

A series of operations of the above-structured charging and discharging inspection device will be explained below.

As mentioned above, the plurality of the batteries 1 are arranged, together with the spacers 18, in a stacked state at given pitches on the magazine base plate 13 of the magazine mechanism 8. FIGS. 5 and 6 show a state where the contact probes are not in contact with the lead terminals 2 and 3 of the batteries 1 aligned on the magazine mechanism 8, whereas the FIGS. 8 and 9 show a state where the contact probes are in contact with the lead terminals 2 and 3 of the batteries 1 aligned on the magazine mechanism 8.

In the state where the magazine mechanism 8 is moved back relative to the inspection mechanism 9 as shown in FIGS. 5 and 6, the lead terminals 2 and 3 of the batteries 1 on the magazine mechanism 8 are not in contact with the contact probes, i.e., power-side and measurement-side contact elements 23 and 24. The power-side and measurement-side contact elements 23 and 24 are self-maintained as shown in FIG. 7. In this state, the lead terminals 2 and 3 of each of the batteries 1 face the power-side and measurement-side contact elements 23 and 24 of the corresponding charging and discharging units 22. Namely, the lead terminal 2 on one side (upper side) of the battery 1 faces the power-side and measurement-side contact elements 23 and 24 of the upper-side charging and discharging unit 22; and the lead terminal 3 on the other side (lower side) of the battery 1 faces the power-side and measurement-side contact elements 23 and 24 of the lower-side charging and discharging unit 22.

Figure 8:
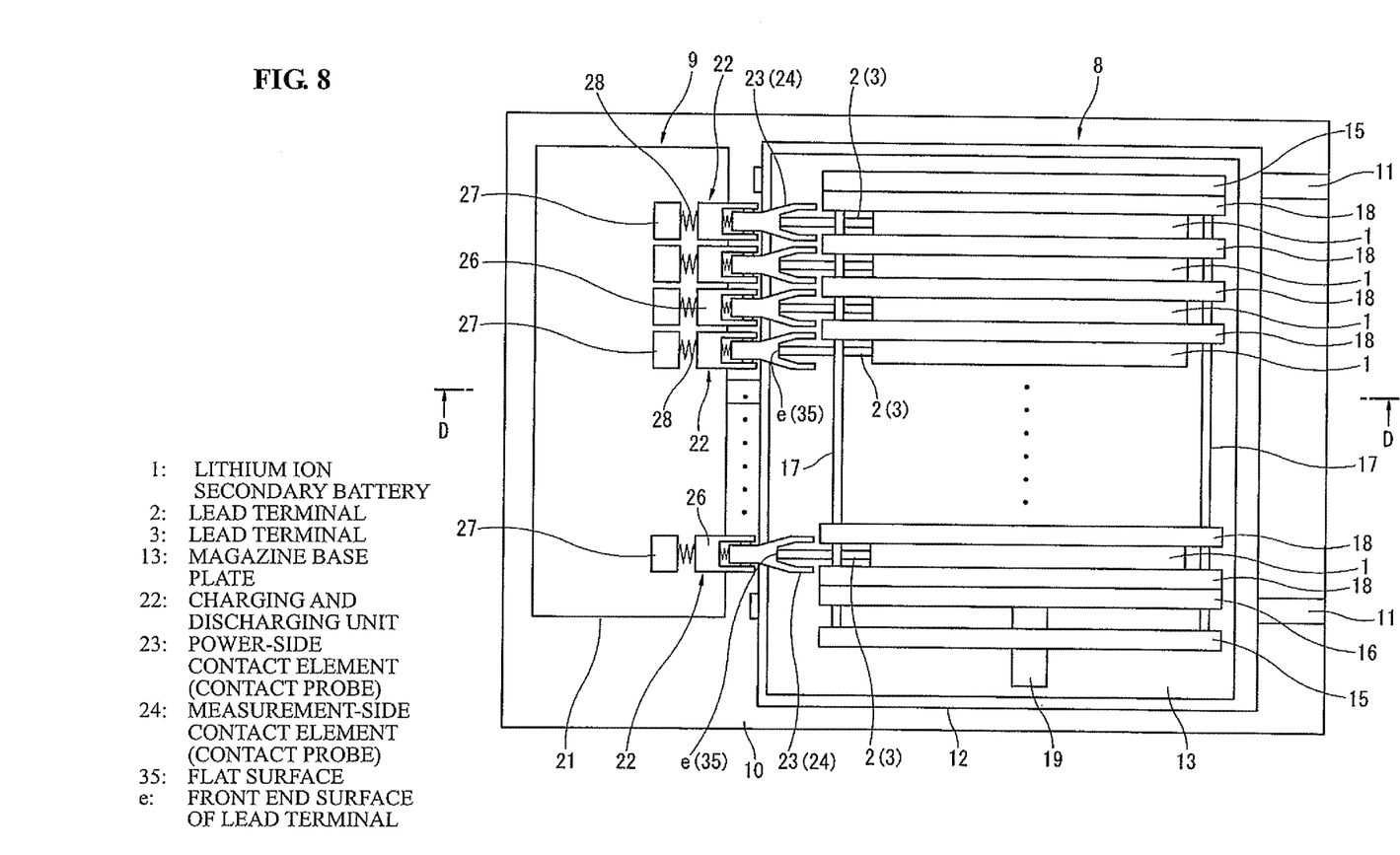
FIG. 8 is a plan view of the charging and discharging inspection device of FIG. 5 in a state where a magazine mechanism slides toward an inspection mechanism.
Figure 9:
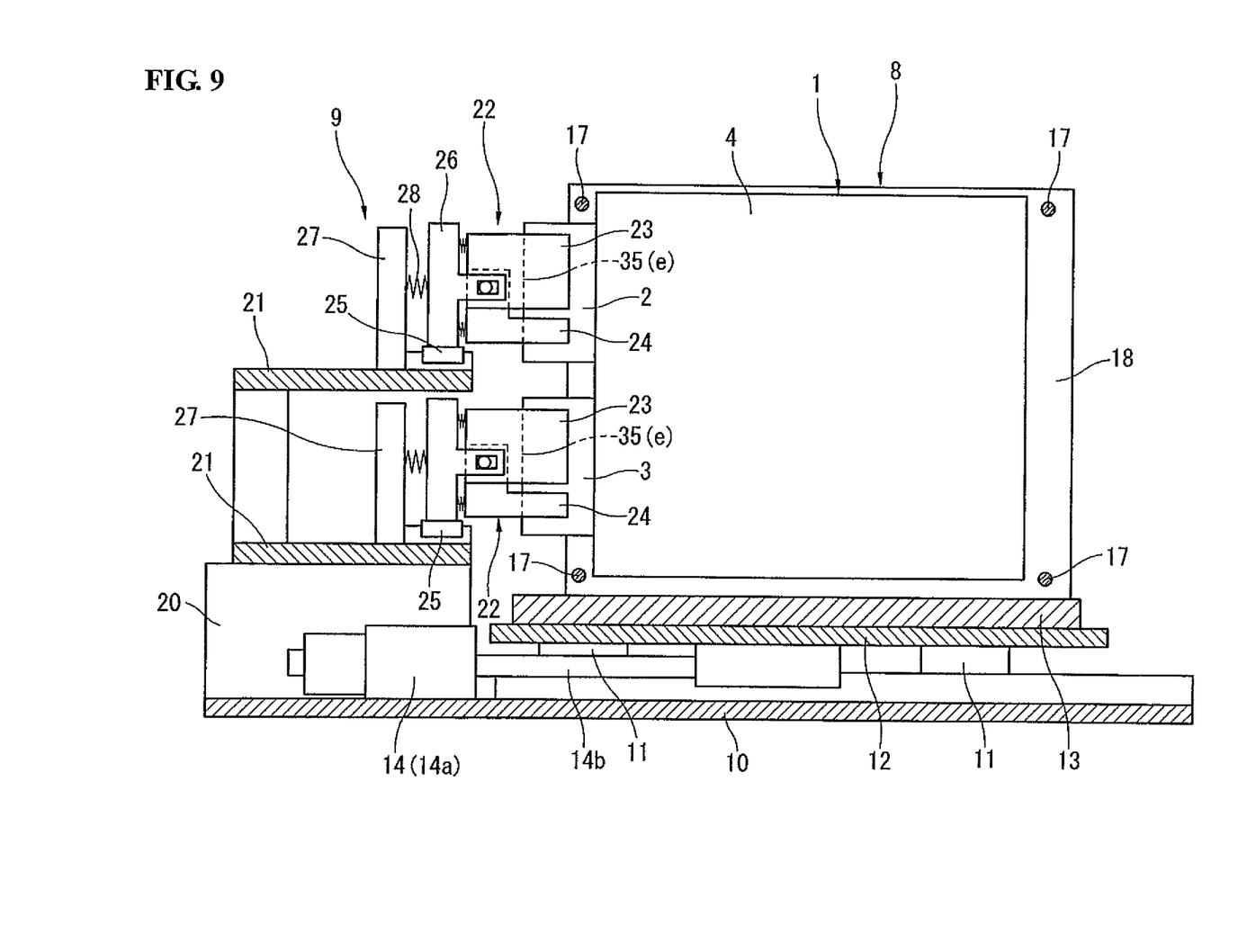
FIG. 9 is a section view of the charging and discharging inspection device taken along line D-D of FIG. 8.

When the magazine mechanism 8 allows the plurality of the batteries 1 to slide together with the base plate 12 by a predetermined stroke toward the left from the state of FIGS. 5 and 6 by operation of the actuator 14, the lead terminals 2 and 3 of the batteries 1 are pushed toward and brought into contact with the contact probes, i.e., power-side and measurement-side contact elements 23 and 24 of the charging and discharging units 22 as shown in FIGS. 8 and 9 so as to establish electrical connection between the lead terminals 2 and 3 of the batteries 1 and the contact elements 23 and 24. At this time, each one of the lead terminals 2 and 3 comes into contact with the pair of the power-side and measurement-side contact elements 23 and 24 nearly at the same time as the power-side and measurement-side contact elements 23 and 24 are arranged vertically side by side within the vertical dimension range of the vertically elongated lead terminal 2, 3 as shown in FIG. 7.

More specifically, the substantially V-like shaped power-side and measurement-side contact elements 23 and 24 are provided as the contact probes as shown in FIG. 7. As the innermost wall surfaces of the V-like shaped receiving grooves 33 are made flat as the flat surfaces 35, the front end surface e of the lead terminal 2, 3 is pressed against and brought into surface-to-surface contact with the flat surfaces 35 of the power-side and measurement-side contact elements 23 and 24. The lead terminal 2, 3 and the contact elements 23 and 24 are electrically connected to each other by such surface-to-surface contact. As mentioned before, the base metal material of the lead terminal 2, 3 is exposed at the front end surface e without having been subjected to surface treatment as shown in FIG. 3.

As shown in FIG. 7, the tapered surfaces 34 are formed on both sides of the flat surface 35 in each of the V-like shaped receiving grooves 33 of the power-side and measurement-side contact elements 23 and 24. By the guide effects of these tapered surfaces 34, the front end surface e of the lead terminal 2, 3 can be properly brought into contact with the flat surfaces 35 of the respective receiving grooves 33 even if there arises a variation in the relative positions of the lead terminal 2, 3 and the receiving grooves 33 of the contact elements 23 and 24 in the groove width direction (i.e. the plate thickness direction of the lead terminal 2, 3).

Further, the sliders 26 of the charging and discharging units 22 on which the contact probes are supported are independently operable for the respective batteries 1 and slidable against the biasing forces of the compression coil springs 28. When the lead terminals 2 and 3 of the battery 1 are simultaneously pressed against the contact probes, i.e., power-side and measurement-side contact elements 23 and 24 of the corresponding charging and discharging units 22, the charging and discharging units 22 are movable backward against the biasing forces of the compression coil springs 28 so as to absorb an error between the relative positions of the lead terminals 2 and 3 of the battery 1 and the power-side and measurement-side contact elements 23 and 24 of the corresponding charging and discharging units 22 in the approaching or separating direction. The lead terminals 2 and 3 of the battery 1 can be thus properly brought into contact with the power-side and measurement-side contact elements 23 and 24 of the corresponding charging and discharging units 22.

Furthermore, the pair of the power-side and measurement-side contact elements 23 and 24, which come into contact with the common lead terminal 2, 3, are individually pivotable and rotatable about the common shaft member 30 relative to the slider 26 and movable backward against the biasing forces of the coil springs 32 relative to the slider 26 as shown in FIG. 7. In consequence, the power-side and measurement-side contact elements 23 and 24 each independently has floating freedom. There is a case that, due to inclination of the battery 1, the front end surface e of the lead terminal 2, 3 is not in parallel to the flat surfaces 35 of the power-side and measurement-side contact elements 23 and 24 at the time when the lead terminal 2, 3 is pressed against the power-side and measurement-side contact elements 23 and 24. Even in such a case, the power-side and measurement-side contact elements 23 and 24 can follow the orientation of the lead terminal 2, 3 by their respective floating freedoms come into intimate contact with the lead terminal 2, 3.

Preferably, the spring constant of the compression coil spring 28 by which the whole of the slider 27 is biased is set smaller than that of the compression coil springs 32 by which the power-side and measurement-side contact elements 23 and 24 are individually and respectively biased as shown in FIG. 7.

As described above, the charging and discharging inspection device of the present embodiment can secure good contact state between the straight front end surfaces e of the lead terminals 2 and 3 of the battery 1 and the flat surfaces 35 of the contact probes, i.e., power-side and measurement-side contact elements 23 and 24 as compared the conventional clip-type system. It is therefore possible to accurately monitor the voltage of the battery 1. It is also possible to, even by the passage of an electrical current to the power-side contact element 23 for the charging and discharging operation after the contact check, suppress the contact resistance of the lead terminal 2, 3 to a lower level than the conventional system and smoothly perform charging and discharging inspection on the battery 1. In addition, it is possible to prevent a temperature rise or thermal load in the contact part between the power-side contact element 23 and the lead terminal 2, 3 of the battery 1 for reduction of power load in air conditioner associated with the charging and discharging inspection device.

The invention claimed is:

1. A charging and discharging inspection device for a thin secondary battery, the thin secondary battery comprising a battery package and thin plate-shaped positive and negative electrode lead terminals protruding from one side of the battery package, the charging and discharging inspection device comprising:

a support member that supports a plurality of the thin secondary batteries in a stacked state; and contact probes arranged facing and being contactable with the respective lead terminals of the plurality of the thin secondary batteries supported by the support member, wherein the support member and the contact probes are adapted to approach or separate from each other such that the contact probes can be simultaneously brought into contact with or separated from the respective lead terminals of the plurality of the thin secondary batteries;

wherein the lead terminals respectively have front end surfaces located at front ends thereof in a protruding direction of the lead terminals and formed with a width corresponding to a plate thickness of the lead terminals;

wherein the contact probes respectively have: substantially V-like shaped receiving grooves defined by opposing tapered surfaces and increasing in width toward the corresponding lead terminals so as to receive therein the corresponding lead terminals; and flat surfaces formed between innermost parts of the opposing tapered surfaces with a width larger than that of the front end surfaces of the lead terminals so as to be contactable with the front end surfaces of the corresponding lead terminals; and wherein, when the contact probes are simultaneously brought into contact with the respective lead terminals of the plurality of the thin secondary batteries by approaching operation of the support member and the contact probes, the contact probes are electrically connected to the respective lead terminals by surface-to-surface contact between the flat surfaces of the contact probes and the front end surfaces of the lead terminals.

2. The charging and discharging inspection device for the thin secondary battery according to claim 1,
wherein base metal materials of the lead terminals are exposed at least at the front end surfaces of the lead terminals without being subjected to surface treatment.

3. The charging and discharging inspection device for the thin secondary battery according to claim 1,
wherein the contact probes are elastically supported so as to be movable back and forth in a direction closer to or away from the respective lead terminals.

4. The charging and discharging inspection device for the thin secondary battery according to claim 1, further comprising:
sliders arranged facing the respective lead terminals of the thin secondary battery supported by the support member so as to be movable back and forth in a direction closer to or away from the respective lead terminals;
elastic members by which the sliders are biased toward the respective lead terminals; and
shaft members arranged in parallel with a direction perpendicular to a plane direction of the lead terminals so as to pivotally and rotatably support the contact probes.

5. The charging and discharging inspection device for the thin secondary battery according to claim 4,
wherein the contact probes are supported so as to be pivotable and rotatable relative to the sliders about the shaft members, which are arranged in parallel with the direction perpendicular to the plane direction of the lead terminals, and movable back and forth relative to the sliders in the direction closer to or away from the respective lead terminals.

6. The charging and discharging inspection device for the thin secondary battery according to claim 5,
wherein the contact probes include power-side and measurement-side contact elements arranged side by side in a width direction of the lead terminals and supported so as to be independently pivotable and rotatable about the shaft members, which are arranged in parallel with the direction perpendicular to the plane direction of the lead terminals, and independently movable back and forth relative to the sliders in the direction closer to or away from the respective lead terminals.

7. The charging and discharging inspection device for the thin secondary battery according to claim 6, further comprising:
elastic members by which the power-side and measurement-side contact elements are biased toward the respective lead terminals while being supported movable back and forth relative the sliders.

8. A charging and discharging inspection method for a thin secondary battery, the thin secondary battery comprising a battery package and thin plate-shaped positive and negative electrode lead terminals protruding from one side of the battery package, the charging and discharging inspection method comprising:
providing a support member and contact probes such that the support member and the contact probes can approach or separate from each other, with the contact probes arranged facing and being contactable with the respective lead terminals of a plurality of the thin secondary batteries supported in a stacked state by the support member,
wherein the lead terminals respectively have front end surfaces located at front ends thereof in a protruding direction of the lead terminals and formed with a width corresponding to a plate thickness of the lead terminals,
wherein base metal materials of the lead terminals being exposed at least at the front end surfaces of the lead terminals without being subjected to surface treatment, and
wherein the contact probes respectively have: substantially V-like shaped receiving grooves defined by opposing tapered surfaces and increasing in width toward the corresponding lead terminals so as to receive therein the corresponding lead terminals; and flat surfaces formed between innermost parts of the opposing tapered surfaces with a width larger than that of the front end surfaces of the lead terminals so as to be contactable with the front end surfaces of the corresponding lead terminals;
simultaneously bringing the contact probes into contact with the respective lead terminals of the plurality of the thin secondary batteries by approaching operation of the support member and the contact probes; and
upon simultaneous contact of the contact probes with the respective lead terminals, electrically connecting the contact probes to the lead terminals by surface-to-surface contact between the front end surfaces of the lead terminals and the flat surfaces of the contact probes.

* * * * *